United States Patent
Endoh et al.

(12) 
(10) Patent No.: US 6,333,468 B1
(45) Date of Patent: Dec. 25, 2001

(54) FLEXIBLE MULTI-LAYERED PRINTED CIRCUIT CABLE

(75) Inventors: Shuhichi Endoh, Fujisawa; Toshihiro Inoue, Sagamihara; Satoshi Takikita, Fujisawa, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/290,310

(22) Filed: Apr. 12, 1999

(51) Int. Cl.[7] ................................ H05K 1/03
(52) U.S. Cl. ................. 174/256; 174/255; 29/830; 428/293.1
(58) Field of Search ................. 174/255, 256, 174/274; 428/209, 567, 293.1; 29/829, 830; 361/794

(56) References Cited

U.S. PATENT DOCUMENTS

| | | | |
|---|---|---|---|
| 4,923,735 | * 5/1990 | Peerlkamp | 428/209 |
| 6,037,044 | * 3/2000 | Giri et al. | 174/255 |
| 6,105,243 | * 8/2000 | Okabe et al. | 29/830 |
| 6,198,362 | * 3/2001 | Harada et al. | 361/794 |

* cited by examiner

Primary Examiner—Albert W. Paladini
(74) Attorney, Agent, or Firm—H. Daniel Schnurmann

(57) ABSTRACT

A thin flexible multi-layered printed circuit cable manufactured by a relatively simple process and having improved electro-magnetic interference and impedance characteristics is described. The cable includes: an insulating substrate layer; a wiring layer formed on the insulated substrate layer; a coating layer laminated on the wiring layer; a first non-woven metal fiber layer laminated on the coating layer; and a second non-woven metal fiber layer laminated on an opposite surface of the substrate layer. Because the cable is coated with a conductive non-woven or woven metal fabric, electromagnetic waves generated during transmission of high speed data are fully shielded. The non-woven or woven fabric having a wide surface area, is soft and can make good surface-to-surface contact.

28 Claims, 3 Drawing Sheets

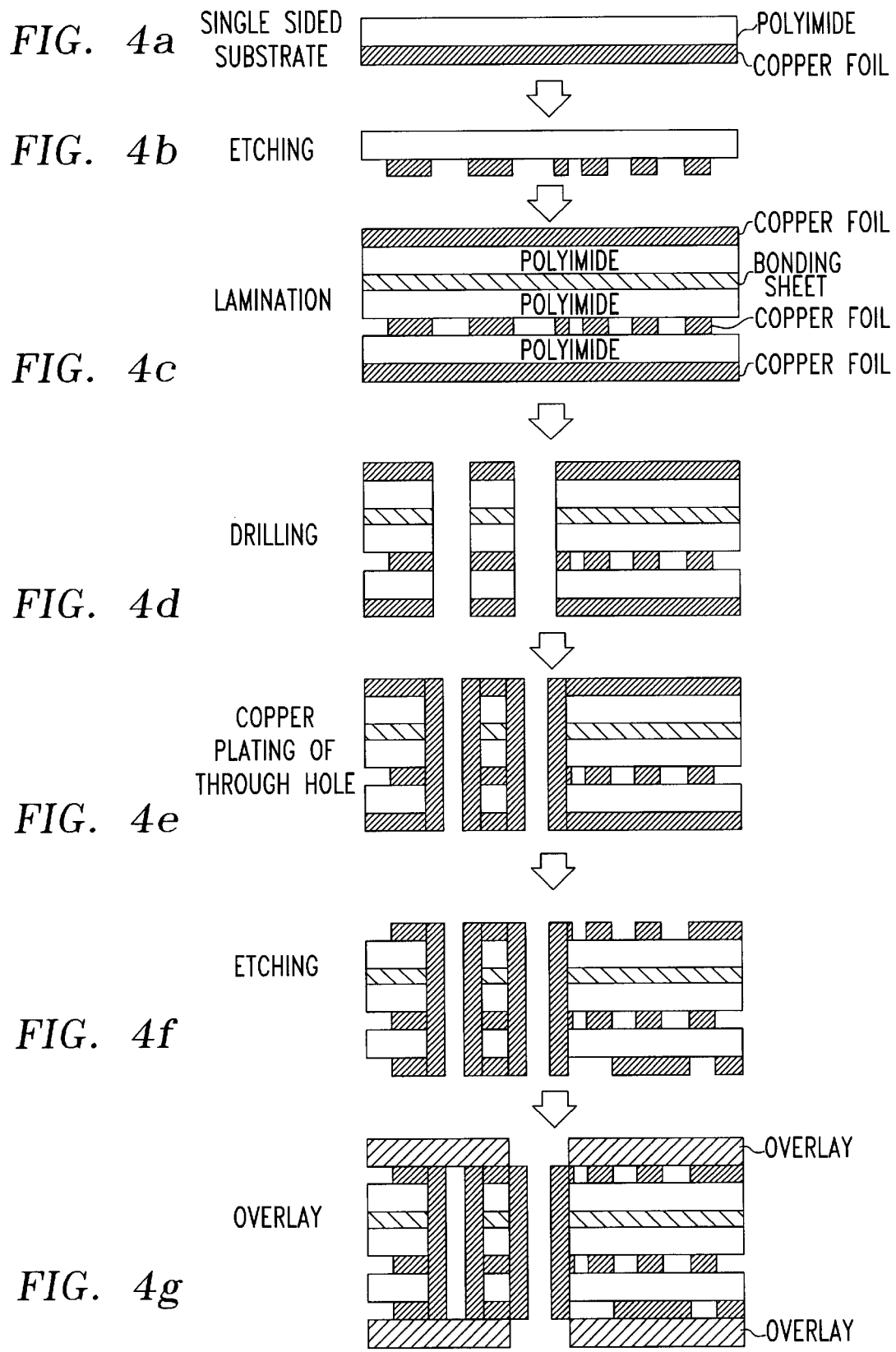

FLEXIBLE MULTI-LAYERED PRINTED CIRCUIT CABLE

FIELD OF THE INVENTION

This invention is related to a flexible multi-layered structure acting as a medium for transmitting electrical signals in an information processing apparatus and, more particularly, to a thin flexible printed circuit (FPC) cable which is manufactured by a relatively simple process and which is provided with excellent electromagnetic interference (EMI) and impedance characteristics.

BACKGROUND OF THE INVENTION

Flexible and easily bendable cable have been widely used as a medium for transmitting electrical signals in a variety of information processing apparatus, which typically include computers. An example of such system is a notebook computer having a "clam shell structure", the computer being provided with a keyboard hinged to a cover and which may also include, among others, a liquid crystal display. It is common practice to use flexible cables to transfer electrical signals, (i.e., video signals) between the main body of the system and the cover. The cover of the computer opens from the main body of the system when the computer is in use, and closes when the computer is not in use. A cable requires a high level of mechanical durability against bending when the flexible cable passes through the hinged portion of the cover since it bends each time the cover opens or closes as represented by XGA (extended Graphic Array). Recently, displays have migrated to finer resolutions. The capacity of the video signals being transmitted have correspondingly risen, thereby increasing the transfer rate of the video signals. For this reason, the manner of transmitting video signals has gone from a conventional parallel transfer mode to a high speed balanced transfer mode, referred to as LVDS (Low Voltage Differential Signal). A high anti-Electromagnetic Interference (EMI) performance and impedance stability are both required for a flexible cable that implements the high speed data transfer, such as LVDS. In addition, mechanical strength, such as durability against bending must also be guaranteed. Finally, it is also desirable that the flexible cable be thin (e.g., no more than 0.5 mm thick), as the notebook computers themselves become thinner.

A flexible cable generally consists of a laminated portion in which both surfaces of a copper foil circuit act as a transmission line interspersed between insulating polyimide films. The polyimide films on both sides are pressed against the copper foil circuit layer by a hot roll using an adhesive which acts as both, a protecting film and an insulating film for the circuit layer.

The structure and the manufacturing process of a conventional flexible cable is now considered with reference to FIG. 4, which illustrates a cross-sectional view of the FPC seen in a direction perpendicular to the direction of the wires configured in the wiring layer. This type of flexible cable is manufactured starting from a single sided substrate, as shown in FIG. 4(a). The single sided substrate consists of a copper foil laminated by a hot roll, and the like, on one side of the substrate insulated by the polyimide film. It is well known by those skilled in the art that single sided substrates of this type have been widely used in industry. A wiring layer is then formed by etching the laminated copper foil to a predetermined pattern, as shown in FIG. 4(b). To protect the wiring layer, the same single sided substrate of FIG. 4 (a) is laminated on the lower layer of the wiring layer (FIG. 4c). The laminated single sided substrate is used as a protective layer. Its use is preferred over a single layer of a polyimide film, particularly since single sided substrates are conventional items readily available in industry. The impedance of the flexible cable is determined generally by the pitch and the width of wires of the wiring layer as well as by the dielectric constant and the size (thickness) of the polyimide film which is a substrate material. However, the impedance may vary when the insulating polyimide film layer contacts another insulating object under normal conditions of usage when the polyimide film layer is exposed. For this reason, a single sided substrate is, likewise, laminated on the upper surface of the substrate to cover the surface with a conductive copper foil layer, as shown in FIG. 4(c). The lamination is done by pasting the bottom surfaces of the substrates with a bonding sheet, and then by applying a hot roll, (FIG. 4c). The upper and lower surfaces are coated with a copper foil or film. Thus, an electromagnetic wave generated by a data signal propagating through the wiring layer at high speed is suitably shielded by the metal film. Further, the impedance characteristic is also stabilized, as described above. However, a copper foil which is exposed to the external environment is susceptible to the danger of peeling off from the polyimide film, or cracking because its mechanical strength is very low. Further, the wiring layer is substantially shielded from the external environment by multiple insulating layers so that the ground-to-ground connection to the frame is very weak. In view of the above, it is necessary for the ground frame portion of the wiring layer to be drilled (or dot punched) as shown in FIG. 4(d). The surface is then copper plated to enhance its grounding characteristics, as illustrated in FIG. 4(e). The upper and the lower surfaces are etched as necessary to form the wiring pattern FIG. 4(f). It may also be advantageous to further coat it with an insulating layer to reinforce the copper foil portion of the surface, as shown in FIG. 4(g). To summarize, prior art cables of the type shown in FIG. 4(g) are characterized by a repeated use of multi-layering the semiconductor substrate.

The flexible cable forming a multi-layered structure shown in FIG. 4(g) may have excellent anti-EMI and impedance characteristics for a media for high-speed transmission of video signals. However, it is not recommended to downsize it to the thickness of the notebook PC because it evidently becomes too thick due to its multi-layered structure. Further, since it is substantially thick, it does not inherently assume the pliableness required for a flexible cable. In addition, the manufacturing process is complicated because of the multi-layering, which naturally results in increased cost.

OBJECTIVES OF THE INVENTION

Accordingly, it is an object of the present invention to provide an improved flexible printed circuit (FPC) cable used as a transmission medium of electric signals in an information processing apparatus that includes a computer system.

It is another object of the present invention to provide a thin, flexible cable which is manufactured by a relatively simple process and which is characterized by having improved EMI and impedance properties.

SUMMARY OF THE INVENTION

This invention was conceived in view of the above described objectives and provides, in a first aspect, a flexible cable in the form of a flexible multi-layered structure that includes an insulating substrate layer, a wiring layer formed on the upper surface of the substrate layer, an insulating coating layer laminated on the wiring layer, and a first non-woven metal fiber fabric layer laminated on the upper surface of said coating layer.

This invention provides, in a second aspect, a flexible cable of a flexible multi-layered structure including an insulating substrate layer, a wiring layer formed on the upper surface of said substrate layer, an insulating coating layer laminated on said wiring layer, a first non-woven metal fiber fabric layer laminated on the upper surface of said coating layer and a second non-woven metal fiber fabric layer laminated on the lower surface of said substrate layer.

This invention provides, in a third aspect, a method of making a flexible cable in the form of a flexible multi-layered structure, that includes the steps of forming a metal foil layer on one surface of an insulating substrate layer, etching the metal foil layer into a predetermined pattern to form a wiring layer, laminating an insulating coating layer on the upper surface of the wiring layer, and laminating a first non-woven metal fiber fabric layer on the upper surface of the coating layer using a conductive adhesive.

This invention provides, in a fourth aspect, a method of making a flexible cable of a flexible multi-layered structure that includes the steps of forming a metal foil layer on one surface of an insulating substrate layer, etching the metal foil layer into a predetermined pattern to form a wiring layer, laminating an insulating coating layer on the upper surface of the wiring layer, laminating a first non-woven metal fiber fabric layer on the upper surface of the coating layer using a conductive adhesive, and laminating a second non-woven metal fiber fabric layer on the lower surface of the substrate layer using a conductive adhesive. In the above, the first and the second non-woven metal fiber fabric layers may be joined to the coating layer or to the substrate via a conductive adhesive layer.

The first and the second non-woven metal fiber fabric layers may be a sintered metal fiber fabric which is made, e.g., of short metal fibers of stainless steel which are surface treated by plating or by a deposition of metal such as copper, gold, nickel and tin. The non-woven metal fibers may be prepared from raw fibers commonly obtained by a conventional wet paper making process by putting it into a hydrogen reduction furnace at high temperature, causing the binder to spatter, and forcing the short fibers to fuse to each other. Such non-woven metal fibers may also be rolled. Rolling may be done before or after fusing in the sintering furnace. The mechanical characteristic such as resiliency and pliableness of the non-woven fiber are further improved by rolling.

The wiring layer generally includes a ground wire. The coating layer may consist of a portion wherein the coating on the ground wire that was removed and the first non-woven metal fiber fabric contacts ground via the removed portion. As a result, the grounding strength of the frame ground of the flexible cable is largely improved. In addition, the end of the first and the second non-woven metal fiber fabric layers may be painted with an insulating resin ink of epoxy, acrylic or silicon based resin. Because each end is coated with resin ink, the fabric is substantially reinforced and the fibers at the end are prevented from fraying. Further, the first or the second non-woven metal fiber fabric may have a reinforcement layer containing a thermosetting adhesive pasted thereto and a part, such as a connector, may be mounted on the opposite side of the reinforcement layer. The adhesive may be painted by, e.g., resin printing. The portion of the non-woven fiber in which the thermosetting adhesive is impregnated is set by heating in order to increase its stiffness. The connector attached to the system board may be mounted at the reinforced portion. While a glass epoxy substrate had to be pasted to the conventional flexible cable (shown in FIG. 4) and then punched, only resin printing is needed in this invention to keep the manufacturing process simple and easily automated.

A fifth aspect of this invention provides a flexible cable of multi-layered structure that includes an insulating substrate layer, a wiring layer formed on the upper surface of the substrate layer, an insulating coating layer laminated on the upper surface of the wiring layer and a woven metal fabric layer laminated on the upper surface of the coating layer.

A sixth aspect of this invention provides a flexible cable of multi-layered structure that includes an insulating substrate layer, a wiring layer formed on the upper surface of the substrate layer, an insulating coating layer laminated on the upper surface of the wiring layer, a first woven metal fabric layer laminated on the upper surface of the coating layer, and a second woven metal fabric laminated on the lower surface of the substrate layer.

A seventh aspect of this invention provides a method of making a flexible cable of multi-layered structure including the steps of forming a metal foil layer on one surface of an insulating substrate layer, etching the metal foil layer to a predetermined pattern to form a wiring layer, laminating an insulating coating layer on the upper surface of the wiring layer, and laminating a first woven metal fabric layer on the upper surface of the coating layer using a conductive adhesive.

An eighth aspect of this invention provides a method of making a flexible cable of multi-layered structure that includes the steps of forming a metal foil layer on one surface of an insulating substrate layer, etching the metal foil layer into a predetermined pattern to form a wiring layer, laminating an insulating coating layer on the upper surface of the wiring layer, laminating a first woven metal fabric layer on the upper surface of the coating layer using a conductive adhesive, and laminating a second woven metal fabric layer on the lower surface of the substrate layer using a conductive adhesive in the above. The first and the second woven metal fabric layers may be joined by a coating and the substrate layers via a conductive adhesive layer.

The first and the second woven metal fabric layers may be a woven metal fabric made of typical fibers which include multiple twisted thin wires of copper or copper alloy containing more than 95% of copper, with the surface treated or tin plated to make it corrosion resistant. The woven metal fabric may also be pressed. Pressing improves its mechanical characteristics, such as increasing the shielding density, preventing fraying and improving bendability of the woven fabric.

The wiring layer generally includes a ground wire. The coating layer may have a portion over the ground wire removed, and the first woven metal fabric layer may contact the ground wire via the removed portion. As a result, the strength of grounding of the frame ground of the flexible cable is largely improved. Epoxy, acrylic or silicon based insulating resin ink may be painted on both ends of the first and the second woven metal fabric layers. Because the fabric is strengthened at the end by a coating of resin ink, the fiber is prevented from fraying.

The first and the second woven metal fabric layers may have a reinforced layer which is pasted to the layers with a thermosetting adhesive impregnated therein, and may have, e.g., a connector mounted on the opposite side of the reinforcing layer. The adhesive may be painted by, e.g., resin printing. The portion of the non-woven fabric in which the thermosetting adhesive is impregnated is hardened by heating, increasing its stiffness. The connector to the system board may be mounted, if so desired, on the reinforced portion. In the case of the conventional flexible cable, as shown in FIG. 4, a glass epoxy substrate is pasted to the conventional flexible cable and then punched whereas, according to the present invention, only resin printing is required so that the manufacturing process is simplified and easily automated.

Simply stated, the flexible cable of this invention is a structure in which the upper and lower sides of the flexible cable are coated with a non-woven metal fabric or a woven metal fabric. Because a non-woven or woven fabric have a wide area, they are much more flexible and allow a surface-to-surface contact, all of which improves grounding. When compared to the prior art (e.g., FIG. 4d), wherein a copper foil portion was dot punched, the flexible cable of this invention has better shielding density to electro-magnetic waves. In addition, because the dielectric polyimide film is coated with a conductive non-woven or woven fabric, there is no danger for the impedance of the cable to become unstable when contacted by another insulation in the environment it is used.

Moreover, the flexible cable of this invention has improved electrical characteristics. Because the non-woven or woven metal fabric is flexible, the cable can bend easily. In addition, the tensile strength of the cable is reinforced by pasting a metal fabric to the cable. Further, as another advantage of the invention, handling of the solder reflow is worth noting. In a conventional flexible cable using a copper foil tape providing electromagnetic shielding, the copper foil cannot be pasted until all the parts have been mounted, i.e., until the final step of the manufacturing process has been reached. In this invention, though, the metal foil can be pasted any time during the manufacturing process of the flexible cable, in view of the heat resistant metal shield being used. Therefore, pasting is efficient and circuit testing can be done during the manufacturing process of the flexible cable. In addition, manual work of pasting after mounting the parts is eliminated altogether.

BRIEF DESCRIPTION OF THE DRAWINGS

Further objects, features and advantages of this invention will be apparent from the detailed description to be described hereinafter based on an embodiment of this invention and the attached drawings.

FIG. 4 is a cross-sectional view of a schematic diagram showing the structure of a prior art flexible cable.

DETAILED DESCRIPTION OF THE INVENTION

The invention will now be described with reference to FIG. 1, in which the schematic diagram of a flexible cable 100, in accordance with a first embodiment of this invention is shown. FIG. 1 illustrates a cross-sectional view taken in a direction perpendicular to the direction of the wires disposed in the wiring layer.

Figure 1A:
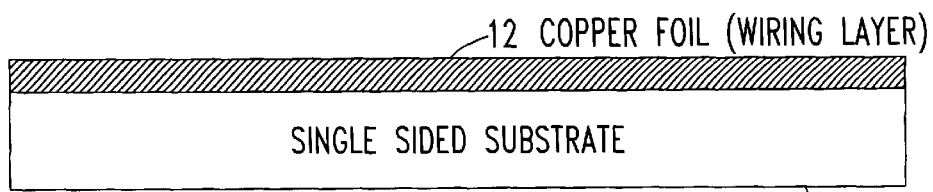
FIG. 1 is a cross-sectional view of a schematic diagram showing the structure and the manufacturing process of a flexible cable, in accordance with a first embodiment of this invention.

The flexible cable 100 is based on a single-sided substrate 10 which includes an insulated substrate of polyimide film with a copper foil laminated on one surface of the substrate by hot rolling and the like, as shown in FIG. 1(a).

Figure 1B:
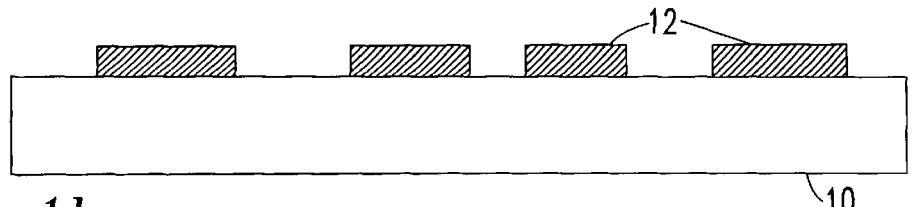
Figure 1C:
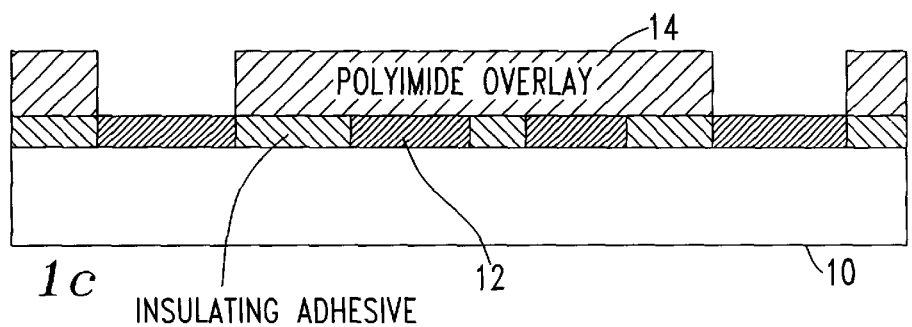

The copper foil laminated on the single sided substrate 10 is then etched to a predetermined pattern to form wiring layer 12 (FIG. 1b). A polyimide film is then laminated as a coating layer 14 on the upper surface of the wiring layer 12 (FIG. 1c). By way of example, the lamination is performed by applying a hot roll after pasting with an insulating adhesive to the insulating coating layer 14. In this step, the portion of the insulating coating 14 overlaying the ground line is removed. This is for the purpose of obtaining a good contact surface to a non-woven or woven metal fabric 16, as will be described hereinafter. A layer made of a non-woven or woven metal fabric 16 is then laminated on the upper surface of the coating layer 14, while the lower surface of the substrate 10 is similarly laminated with a non-woven or woven metal fabric layer 18. The lamination of these non-woven or woven metal fabric layers 16 and 18 is done by applying a hot roll after pasting the coating layer 14 using, e.g., a conductive adhesive.

Figure 1D:
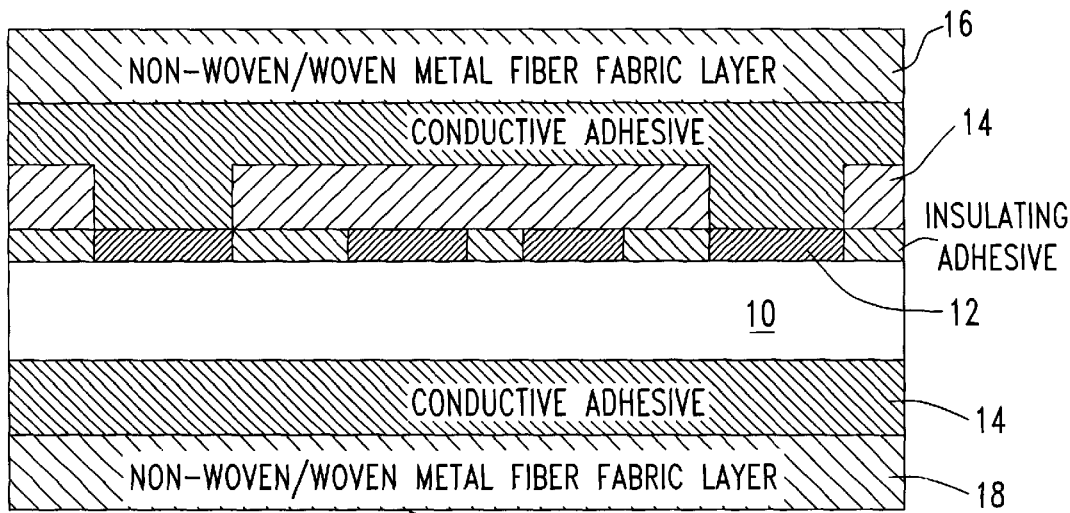

The flexible cable shown in FIG. 1(d) is characterized by a substantially improved electrical performance. Because the flexible cable 100 is covered with a conductive non-oven or woven fabric, the electromagnetic waves generated during the transmission of high speed data are shielded. Because the non-woven and woven fabric have a wide surface area, it is soft and makes excellent surface-to-surface contact; thus, grounding will be significantly enhanced. When compared to prior art which typically uses dot punching (refer to FIG. 4d), high shielding density is available. In addition, because the dielectric polyimide film is covered by a conductive non-woven or woven fabrics 16 and 18, there is no danger for the impedance of the cable to become unstable when contacted to another insulation while in use. Experimental results show that the impedance of the flexible cable is stabilized within ±5% (more specifically, 100Ω±5%) while the impedance of a conventional flexible cable varies ±5% in its environment of use.

The insulating coating layer 14 has a portion overlying the ground line of the wiring layer 12 removed, as shown in FIG. 1(d). As a result, grounding of the frame ground of the flexible cable 100 is enhanced.

The flexible cable 100 is further characterized by its improved mechanical properties. By way of example, the flexible cable 100 is pliable since the metal fabric used as metal layers 16 and 18 are soft. In addition, the metal fabric (whether woven or non-woven) being a fiber is provided with significant tensile strength. Therefore, the flexible cable 100 upon which the metal fabric is pasted on both sides has an increased mechanical strength and durability against bending. Accordingly, the flexible cable 100 is sufficiently durable when used on the hinged portion of the clam shell structure.

The flexible cable 100 of this embodiment is further characterized by the reflow and solder bath inherent of the invention. Since a conventional flexible cable using a copper foil tape for electromagnetic shielding is not heat resistant, the copper foil cannot be pasted until all the parts had been mounted, i.e., until the final step of the manufacturing process. In this invention, the metal fabric can be pasted any time during manufacturing because a heat resistive metal fabric is used (more specifically, a heat resistant epoxy based adhesive is also included to paste the metal fabric). Therefore, the pasting step of the process is efficient and testing can be done at any time during manufacturing. In addition, the manual work of pasting after mounting the parts can be eliminated.

Referring to the non-woven metal fabric used as layers 16 and 18, coating of both surfaces of the flexible cable 100 may be a achieved by a sintered metal fiber fabric which includes, e.g., short metal fiber of a stainless steel.

The method of making a sintered metal fiber fabric will now be briefly explained. Using a 'wet paper making' technique, a raw sheet of metal including a large number of short stainless steel fibers having 1–8 $\mu$m in diameter and 1–5 mm in length is formed. An example of such stainless steel material is SUS316L, which is characterized by its excellent anti-beating, anti-chemicals, anti-erosion, non-magnetic and electrical conductivity characteristics. The diameter and the length of the short metal fibers may be decided by the groundrules of the manufacturing technology. By way of example, in order to obtain the required thickness of the raw sheet after achieving a uniform process, the diameter of the fiber should be less than 10 $\mu$m. Also, in order to maintain a uniform precipitation rate during manufacturing, the length of the fiber should preferably exceed 20 $\mu$m. The final thickness of the resulting sintered fabric is decided by the length of the fiber. Because it is necessary to keep the thickness of the flexible cable 100 after it is pasted with metal layers 16 and 18 below 0.5 mm, the thickness of the fibers should be less than 70 $\mu$m.

An example of a raw metal sheet is a sintered stainless steel fiber sheet known as "Tomyfileck SS". However, since the raw sheet contains a binder, the electrical and mechanical characteristics are poor and cannot be used as metal fabric, as required by the invention. Therefore, the raw sheet is placed in a hydrogen reduction furnace at a temperature ranging between 1300°–1400° C. to spatter the binder and fuse the short fibers together (sinter) in the process of forming a non-woven metal fabric. Further, in order to improve the EMI characteristics of the non-woven metal fabric, the surface of the fibers of the fabric is plated with a metal having high electrical conductivity, such as gold, copper, nickel and tin, and the like. The non-woven metal fabric may be further pressed by rolling. Finally, the pressure roll improves the mechanical characteristic, enhancing its stiffness and the pliability of the non-woven fabric.

The woven metal fabric used as metal layers 16 and 18 may be a woven metal fabric made of fibers (threads) which include of multiple twisted thin wires of copper or a copper alloy or containing more than 95% of copper with the surface thereof being tin plated or treated to make it anti-corrosive. This woven metal fabric may be further pressed. The pressing improves its mechanical characteristics by increasing its shielding density, prevention of fraying and pliableness of the woven fabric.

Figure 2:
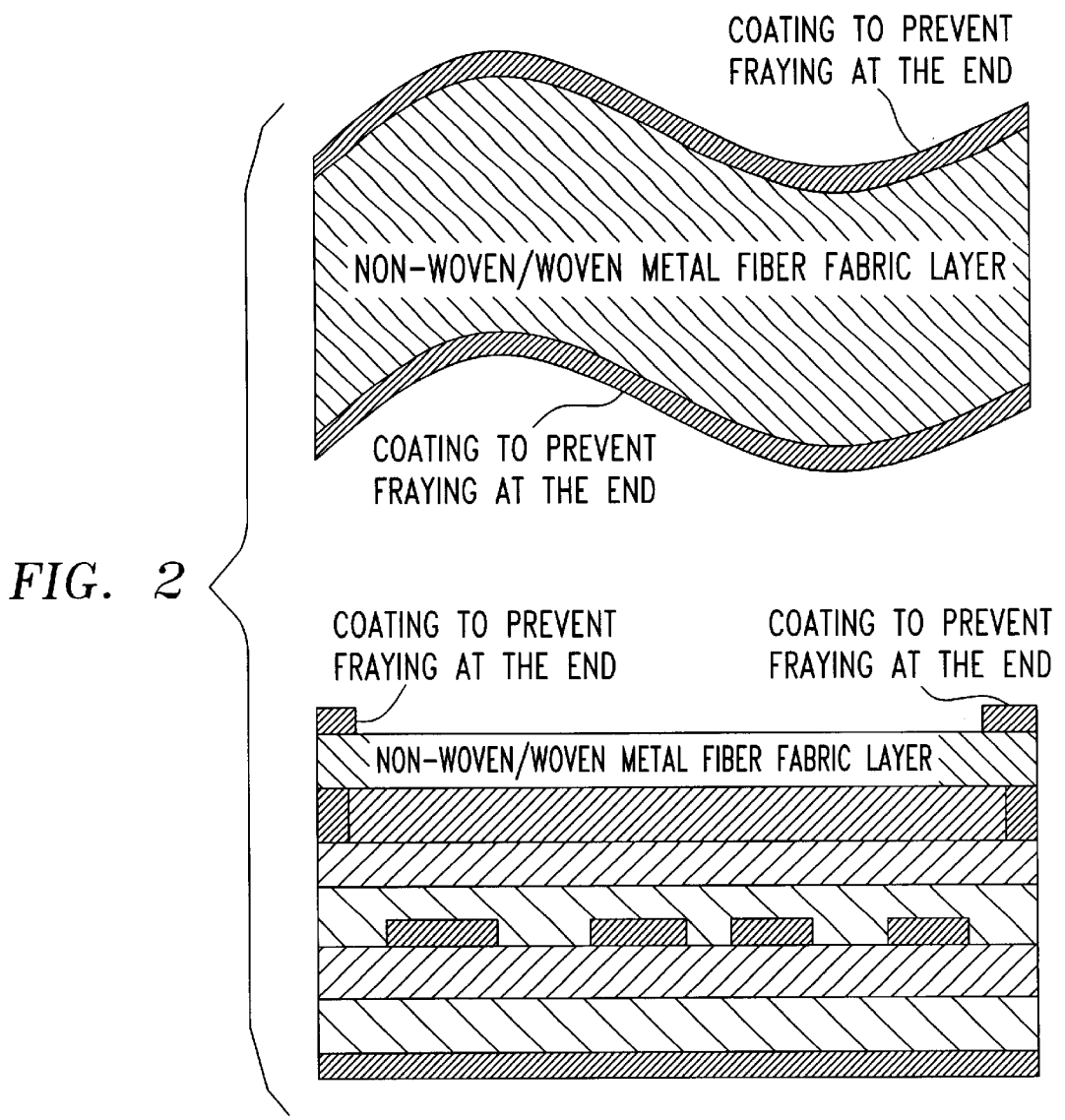
FIG. 2 shows a plan or view of a flexible cable of another embodiment of this invention.

FIG. 2 shows a perspective view seen from the top of the flexible cable 100 in yet another embodiment of the present invention. As shown, each end of the non-woven or woven metal fabric 16 and 18 is painted with insulating resin ink. The resin ink may be an epoxy, whether acrylic or silicon based. By way of example, a coating material referred to as "COATING PASTE" (type number CR-18-KT1) supplied by Asahi Chemical Laboratory may be used advantageously as a thermosetting polyester resin acting as a binder. The coating material is diluted by a diluent such as "SOLVENT#3000" or by butyl-cellosolve and printed on the flexible cable 100 using a silk screen. The flexible cable 100 is then placed in an infrared furnace at 80° C.–150° C. for 5 to 30 minutes for hardening. Because each end is coated with resin ink, the fabric is reinforced and the fibers at its end are prevented from fraying. Also, the resin ink may be easily painted by conventional painting.

Figure 3:
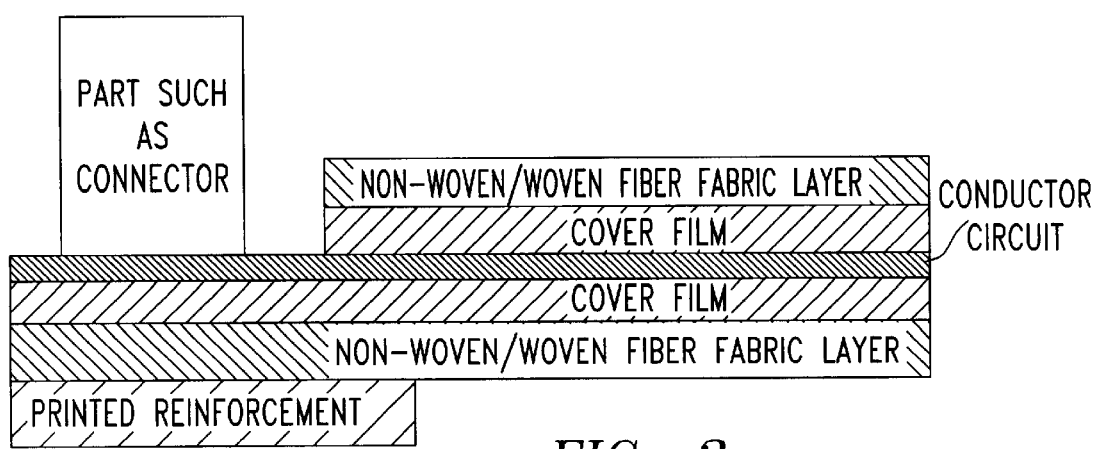
FIG. 3 shows a cross-sectional view of a flexible cable of yet another embodiment of this invention.

FIG. 3 shows a cross-sectional view of the approximate end portion of the flexible cable. As shown, the approximate end of one of the non-woven or woven metal fabric layers 16 and 18 includes a portion which is reinforced by printing, and an electronic section which is mounted on the opposite side of the previous portion. The part which is reinforced by printing may be formed by impregnating a thermosetting adhesive in the non-woven or woven metal fabric 16 and 18 followed by heating. Due to the thermosetting characteristics, the reinforced portion hardens by itself, becoming more rigid.

The adhesive may be easily painted, e.g., by resin printing. A connector to the system board may be mounted on the opposite surface of the reinforced portion. In the case of the conventional flexible cable, a glass epoxy substrate may be pasted to the conventional flexible cable and then punched, in which case only resin printing is required. This simplifies the manufacturing process and allows automation.

This invention has thus far been described with reference to specific embodiments. However, it will be evident to those skilled in the art that changes and modifications may be introduced without departing from the scope of the invention.

Moreover, the specific make of the woven and non-woven fabric, the dimensions of the threads, and the materials used described above may be substantially altered by those skilled in the art to achieve substantially the same structure. Those as well as other modifications are intended to be included within the scope of the present invention.

What is claimed is:

1. A flexible multi-layered structure comprising:

an insulated substrate layer;

a wiring layer formed on said insulated substrate layer;

an insulated coating layer formed on said wiring layer;

and a first metal fiber layer laminated on said insulated coating layer.

2. A flexible multi-layered structure comprising:

an insulating substrate layer;

a wiring layer formed on said insulated substrate layer;

a coating layer laminated on said wiring layer;

a first non-woven metal fiber layer laminated on said coating layer; and a second non-woven metal fiber layer laminated on an opposite surface of said substrate layer.

3. The flexible cable of claim 2, wherein said non-woven metal fiber layer is joined to said coating layer by a conductive adhesive.

4. The flexible cable of claim 2, wherein said second non-woven metal fiber layer is joined to said substrate layer by a conductive adhesive.

5. The flexible cable of claim 2, wherein said wiring layer further comprises a coated ground wire, and wherein said coating layer has a portion such that said coating on said ground wire is removed, said first non-woven metal fiber layer contacting said coated ground wire by way of said removed portion.

6. The flexible cable of claim 2, wherein at least one end of each of said first and second non-woven metal fiber layers is insulated.

7. The flexible cable of claim 6, wherein said at least one end of said second non-woven metal fiber layer is painted with an insulation which is selected from the group consisting of resin ink, acrylic, epoxy, silicon based resin acrylic, and silicon based resin.

8. The flexible cable of claim 2, wherein said first and second non-woven metal fiber layers have a reinforcement layer with thermosetting adhesive impregnated therein.

9. The flexible cable of claim 8, further comprising a connector mounted on an opposite side of said reinforcement layer.

10. The flexible cable of claim 9, wherein said non-woven metal fiber layer forms a surface which is treated by plating or by deposition of metal.

11. The flexible cable of claim 10, wherein said plating and said deposition of metal is followed by pressure rolling.

12. The flexible cable of claim 11, wherein said metal is selected from the group consisting of copper, gold, nickel and tin.

13. The flexible cable of claim 2, wherein said non-woven metal fiber layers are formed of sintered metal fibers.

14. The flexible cable of claim 10, wherein said sintered metal fibers are made of stainless steel.

15. The flexible cable of claim 2, wherein said second non-woven metal fiber layers is comprised of sintered metal fibers made of metal fibers of stainless steel, and wherein said non-woven metal fiber layers are surface treated by plating or by metal deposition followed by pressure rolling.

16. A flexible multi-layered structure comprising:
   an insulated substrate;
   a wiring layer formed on a surface of said substrate;
   an insulating coated layer formed on said wiring layer;
   and a first woven metal fiber layer laminated on said insulating coated layer.

17. The flexible cable of claim 16, wherein said first woven metal fiber layer is joined to said coating layer by way of a conductive adhesive.

18. The flexible cable of claim 16, further comprises a woven metal fiber layer laminated on a second surface of said insulated substrate.

19. The flexible cable of claim 18, wherein at least one end of said second woven metal fiber layers is painted with insulating resin ink of epoxy, acrylic or silicon based resin.

20. The flexible cable of claim 18, wherein said second woven metal fiber layer has a reinforcement layer having a thermosetting adhesive impregnated therein.

21. The flexible cable of claim 20, wherein a connector is mounted on an opposite side of said reinforcement layer.

22. The flexible cable of claim 16, wherein said wiring layer includes a ground wire, and wherein said coating layer has a portion thereof that is removed, said first woven metal fiber layer contacting ground wire by way of said removed portion.

23. The flexible cable of claim 16, wherein at least one end of said first woven metal fiber layer is painted with insulating resin ink of epoxy, acrylic or silicon based resin.

24. The flexible cable of claim 16, wherein said first woven metal fiber layer has a reinforcement layer having a thermosetting adhesive impregnated therein.

25. The flexible cable of claim 16, wherein said first woven metal fiber layer has a connector mounted on an opposite side of said reinforcement layer.

26. The flexible cable of claim 16, wherein said first woven metal layer is comprised of fibers consisting of multiple twisted wires.

27. The flexible cable of claim 26, wherein said multiple twisted wires are made of a metal selected from the group consisting of copper and copper alloy containing more than 95% of copper.

28. The flexible cable of claim 16, wherein said non-woven metal fiber layer is treated by plating or by deposition of metal, followed by pressure rolling.

* * * * *